United States Patent [19]

Limberg

[11] 3,903,479

[45] Sept. 2, 1975

[54] TRANSISTOR BASE BIASING USING SEMICONDUCTOR JUNCTIONS

[75] Inventor: Allen LeRoy Limberg, Lambertville, N.J.

[73] Assignee: RCA Corporation, New York, N.Y.

[22] Filed: Jan. 24, 1974

[21] Appl. No.: 436,039

[52] U.S. Cl. .......................... 330/22; 330/19; 330/40

[51] Int. Cl.$^2$ .......................... H03F 3/04

[58] Field of Search .............. 330/19, 22, 40, 24, 32

[56] References Cited

UNITED STATES PATENTS

| | | | |
|---|---|---|---|
| 3,035,233 | 5/1962 | Heyser | 330/24 |
| 3,471,795 | 9/1969 | Schilling | 330/22 X |
| 3,501,710 | 3/1970 | Liepins et al. | 330/40 X |
| 3,573,645 | 4/1971 | Wheatley, Jr. | 330/15 |

*Primary Examiner*—R. V. Rolinec
*Assistant Examiner*—Lawrence J. Dahl
*Attorney, Agent, or Firm*—H. Christoffersen; S. Cohen; A. L. Limberg

[57] ABSTRACT

A multiple base-emitter potential ($V_{BE}$) supply is direct coupled via a semiconductor junction to the base electrode of a "grounded-emitter" amplifier transistor to provide forward bias to its base-emitter junction. The semiconductor junction functions as a resistance coupling element, coupling a source of input signal to the base-emitter junction of the amplifier transistor.

20 Claims, 7 Drawing Figures

TRANSISTOR BASE BIASING USING SEMICONDUCTOR JUNCTIONS

The present invention relates to the quiescent base biasing of a "grounded-emitter" transistor amplifier.

A "grounded-emitter" transistor amplifier is a common-emitter transistor amplifier which does not use emitter degeneration elements, but in which the emitter electrode of the transistor is connected directly or substantially directly to a point of fixed potential. That is, the emitter electrode of the transistor is "grounded" for a-c signal components. The transistor in the grounded-emitter transistor amplifier may comprise a composite transistor formed by a Darlington cascade connection of component transistors, with the emitter electrode of the final transistor in the cascade connection directly connected to a point of fixed potential.

The common emitter forward current gain of a transistor is referred to by the symbol $h_{fe}$. The transconductance of a transistor--that is, its collector current variations divided by its base-emitter voltage variations—is referred to by the sumbol $g_m$.

A multiple $V_{BE}$ potential supply is a potential supply providing a potential which is equal (1) to the sum of the base-emitter offset potentials ($V_{BE}$'s) of a plurality of transistors or (2) to a multiple of the base-emitter offset potential of one transistor or (3) to the sum of the multiples of the base-emitter offset potentials of a plurality of transistors. A variety of circuits to perform the multiple $V_{BE}$ potential supply function are known.

Resistance coupling of loop circuits is effected by their sharing a resistive element commonly connected in each of them. The term "resistance-coupled amplifier" describes an amplifier wherein the source of input signal is connected to cause current variations responsive to the input signal in a resistor connected between the input and common terminals of a following three-terminal amplifier device.

The present invention is embodied in a resistance-coupled "grounded-emitter" transistor amplifier using a simple or composite transistor which is provided stable base-emitter biasing from a multiple $V_{BE}$ potential supply via a non-linear unilaterally conductive base-bias resistive element, which non-linear resistive element is included in the resistance coupling.

Figure 3:
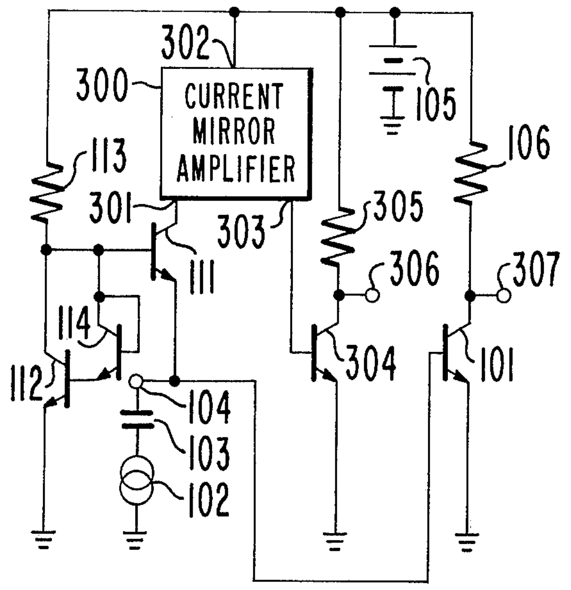
FIG. 3 is a schematic diagram partially in block form of a phase-splitter embodying the present invention.
Figure 4:
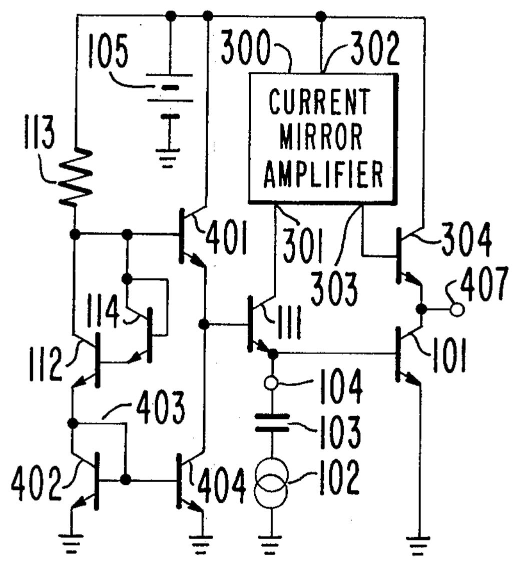
Figure 5:
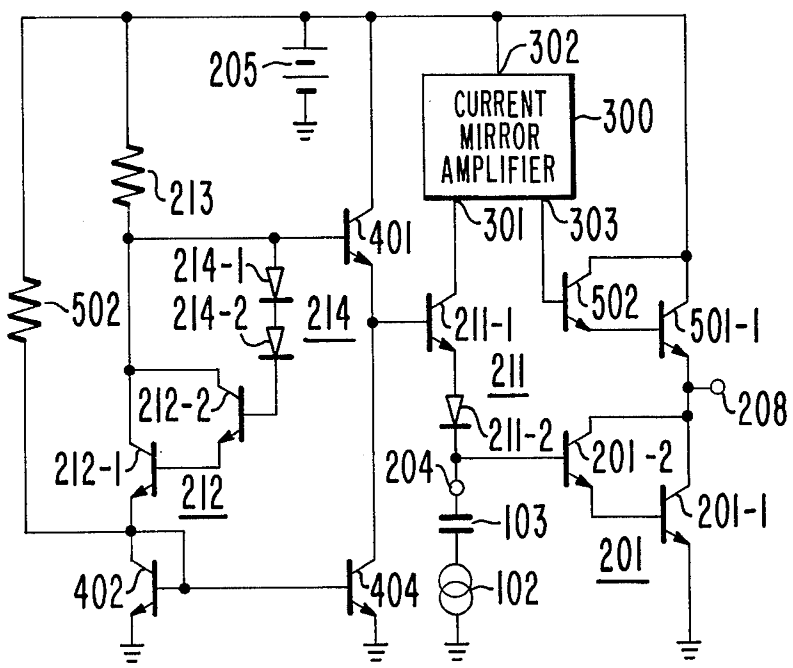
Figure 6:
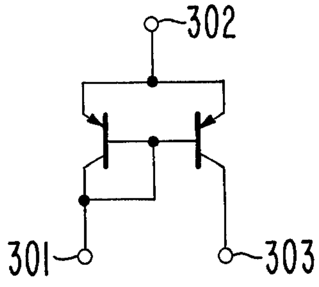
Figure 7:
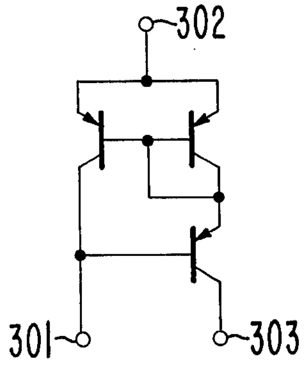

FIGS. 4 and 5 are schematic diagrams partially in block form of push-pull amplifier embodying the present invention; and FIGS. 6 and 7 are schematic diagrams of types of current mirror amplifiers which may be used in the construction of the circuits diagrammed in FIGS. 3, 4 and 5.

Figure 1:
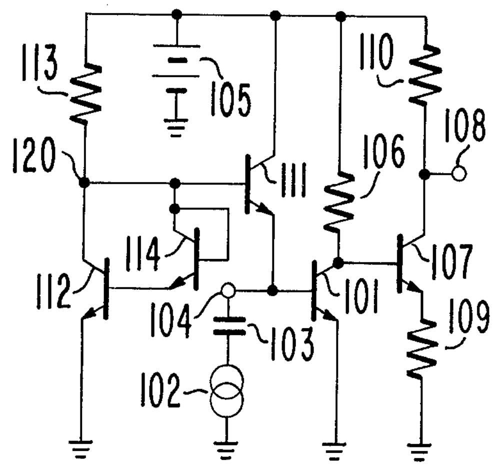
FIG. 1 is a schematic diagram of a grounded-emitter transistor amplifier which is biased according to the present invention.

In FIG. 1, transistor 101 is connected as a "grounded-emitter" amplifier--that is, its emitter electrode is connected to a fixed potential which serves as a-c signal ground. A-c input signal from a source 102 is coupled via a coupling capacitor 103 to a terminal 104 connected to the base electrode of transistor 101. The collector electrode of transistor 101 is coupled to a supply 105 of operating potential by a collector load resistor 106. The quiescent collector current of transistor 101 flows through resistor 106 to develop potential drop thereacross such as to provide suitable bias potential for the base electrode of transistor 107. The input signal variations coupled to the base electrode of transistor 101 cause variations of its collector current to cause an amplified signal to appear at the collector electrode of transistor 101.

This amplified signal applied to the base electrode of transistor 107, connected as a common-emitter amplifier, produces a further amplified signal at output terminal 108. The common-emitter amplifier connection of transistor 107 includes an emitter degeneration resistor 109 and a collector load resistor 110.

The FIG. 1 amplifier circuitry insofar as described above resembles the prior art. Unlike prior art resistance-coupled amplifiers, however, the FIG. 1 input amplifying stage built around transistor 101 does not use linear resistors in its bias network. The base-emitter junction of transistor 111 is used instead of a base bias resistor to apply base potential to transistor 101. The emitter resistance of transistor 111 is the principal means used for resistance coupling of input signal from source 102 to transistor 101.

A $2V_{BE}$ bias potential equal to the sum of the base-emitter offset potentials $V_{BE112}$ and $V_{BE114}$ of transistors 112 and 114, respectively, is applied to the base electrode of transistor 111. The base-emitter electrode offset potential of transistor 111 subtracts a $1V_{BE}$ quiescent potential from this $2V_{BE}$ bias potential to leave a $1V_{BE}$ quiescent potential for application to the base electrode of transistor 101. This quiescent base-emitter potential varies with temperature so as to provide temperature-compensation which maintains the quiescent emitter current of transistor 101 substantially constant despite temperature changes, and the constancy of the quiescent collector current of transistor 101 over a temperature range can be better for a given value of the emitter resistance of transistor 111 than for a linear resistor of similar resistance.

The $2V_{BE}$ bias potential applied to the base electrode of transistor 111 is shown as being developed by a voltage regulating transistor 112. Transistor 112 is supplied collector and base currents via resistor 113 from supply 105 and provided with collector-to-base feedback via diode-connected transistor 114 hereinafter referred to simply as a "diode." Diode 114 is poled to be forward biased by the base current flowing to transistor 112. The connection of the collector electrode of transistor 112 to supply 105 by means of resistor 113 tends to raise the potential at that collector electrode to the supply potential. However, as the collector potential of transistor 112 tries to exceed a $2V_{BE}$ potential--that is, a potential equal to the offset potential across a serially connected pair of semiconductor junctions--diode 114 and the base-emitter junction of transistor 112 are forward biased into conduction. Transistor 112 responds to the forward biasing of its base-emitter junction to withdraw a collector current from node 120 developing a potential drop across resistor 113 which reduces the forward bias potential coupled to its base-emitter junction via diode 114. The degenerative collector-to-base feedback provided transistor 112 by means of diode 114 stabilizes the collector potential of transistor 112 to a $2V_{BE}$ potential. This $2V_{BE}$ potential is of a value to cause the collector current $I_{C112}$ of transistor 112 is to be substantially equal to the current $I_{113}$ flowing through resistor 113. The base current of transistor 112 is smaller than $I_{C112}$ by the $h_{fe}$ of transistor 112 and the base current of transistor 111 is smaller yet by the additional factor of its $h_{fe}$.

The particular value of this $2V_{BE}$ potential can be calculated as follows. The potential drop $V_{113}$ appearing across resistor 113 having a resistance $R_{113}$ causes a current $I_{113}$, therethrough. By Ohm's Law:

$$I_{113} = V_{113}/R_{113} \quad (1)$$

$$V_{113} = V_{CC} - (V_{BE112} + V_{BE114}) \quad (2)$$

where:

$V_{CC}$ is the direct potential provided by supply 105,

$V_{BE114}$ is the drop across forward-biased diode 114, and $V_{BE112}$ is the base-emitter offset potential of transistor 112. Combining equations 1 and 2:

$$I_{113} = \frac{V_{cc} - V_{BE112} - V_{BE114}}{R_{113}} \quad (3)$$

Now, $I_{113}$ is substantially equal to the sum of the collector and base currents of transistor 112 which is equal to its emitter current $I_{E112}$. (The base current of transistor 111 is negligibly small.) The sum of $V_{BE114}$ and $V_{BE112}$ will be substantially equal to 1.3 volts over a wide range of current, being decreased about 36 millivolts each time $I_{E112}$ is halved. So, $I_{103}$ and $I_{E112}$ are well-defined, so long as $V_{CC}$ exceeds $V_{BE114} + V_{BE112}$ by a volt or more. Now, from the equation defining semiconductor diode action:

$$V_{BE112} = \frac{kT}{q} \ln \frac{I_{E112}}{I_{S112}} \quad (4)$$

$$V_{BE114} = \frac{kT}{q} \ln \frac{I_{E114}}{I_{S114}} \quad (5)$$

where:

$k$ is Boltzmann's constant, $T$ sis absolute temperature, $q$ is the charge on an electron, $I_{E112}$ and $I_{E114}$ are the emitter currents of transistors 112 and 114, respectively, and $I_{S112}$ *and* $I_{S114}$ are the saturation emitter currents of transistors 112 and 114 respectively. The base current of transistor 112, $I_{B112}$ equals $I_{E114}$. The relationship $I_{E112}$ to $I_{B112}$ in terms of the common-emitter forward current gain $h_{fe112}$ of transistor 112 is known to be:

$$I_{E112} = (h_{fe112} + 1)\, I_{B112} \quad (6)$$

Therefore, from equations 4, 5 and 6, and related facts, the potential applied to the base electrode of transistor 11 equals:

$$V_{BE112} + V_{BE114} = \frac{kT}{q} \ln \frac{I_{113}^2}{(I_{S112})\,(I_{S114})\,(h_{fe112}+1)} \quad (7)$$

This same potential will equal the sum of the base-emitter offset potentials $V_{BE101}$ and $V_{BE111}$ of transistors 101 and 111, respectively, that is:

$$V_{BE101} + V_{BE111} = V_{BE112} + V_{BE114} \quad (8)$$

Again, from the equation defining semiconductor diode action:

$$V_{BE101} = \frac{kT}{q} \ln \frac{I_{E101}}{I_{S101}} \text{ and} \quad (9)$$

$$V_{BE111} = \frac{KT}{q} \ln \frac{I_{E111}}{I_{S111}} \quad (10)$$

where:

$I_{E101}$ and $I_{E111}$ are the emitter currents of transistors 101 and 111 respectively, and $I_{S101}$ and $I_{S111}$ are the saturation emitter currents of transistors 101 and 111, respectively. Observing that $I_{B101}$, the base current of transistor 101, equals $I_{E111}$ and is smaller than $I_{E101}$ by a factor $(h_{fe101}+1)$, where $h_{fe101}$ is the common-emitter forward current gain of transistor 101, equations 7, 8, 9 and 10 can be combined to obtain equation 11, following.

$$I_{E101} = I_{113} \sqrt{\frac{I_{S101}\, I_{S111}(h_{fe101}+1)}{I_{S112}\, I_{S114}\,(h_{fe112}+1}} \quad (11)$$

Note that the emitter current $I_{E101}$ of transistor 101 has no marked dependency upon temperature except as may occur with current $I_{113}$, $I_{S101}$, $I_{S111}$, $I_{S112}$ and $I_{S114}$ are known to increase in the same manner with temperature; and these changes with temperature are offsetting insofar as $I_{E101}$ is concerned. So, too, the changes with temperature in $h_{fe101}$ and $h_{fe112}$ are offsetting insofar as $I_{E101}$ is concerned. Since $I_{113}$ is stably determined if $V_{CC}$ exceeds $V_{BE112} + V_{BE114}$ by a volt or more, if $R_{113}$ is reasonably fixed in value, it is clear that this biasing method results in exceptional stability of the operating point of transistor 101 despite temperature change.

It can be shown that when transistors 101 and 112 are matched and transistors 111 and 114 are matched, the stability of the operating point is equivalent to that obtained were resistor 113 included as an emitter resistance for transistor 101 so as to obtain emitter degeneration of current feedback. However, the present invention provides this stability without need for an emitter by-pass capacitor to realize the full common-emitter amplifier gain of transistor 101 and without need for additional supply voltage to accomodate the potential drop appearing across such an emitter degeneration resistance. In this special case when transistors 101 and 112 are matched and transistors 111 and 114 are matched, $I_{S101} = I_{S112}$, $I_{S111} = I_{S114}$ and $h_{fe101} = h_{fe112}$ resulting in $I_{E101} = I_{E113}$. This case is of particular interest where the resistance $R_{106}$ of resistor 106 equals $R_{113}$ since the base electrode of transistor 107 will be stably biased to a $2V_{BE}$ potential permitting quite accurate determination of its operating point despite its being direct coupled after a preceding stage with high current gain.

In general, as is known, the saturation currents of transistors having the same diffusion profiles are directly proportional to the areas of their base-emitter junctions. The $h_{fe}$'s of transistors with similar diffusion profiles are closely similar over a wide range of densities of current flow through their base-emitter junctions. These facts coupled with equation 11 permit the design of configurations in which $I_{E101}$ and $I_{113}$ are related in different proportions.

Returning to the focal point of the invention, the base biasing resistance afforded transistor 101 by the base-emitter junction of transistor 111 does not exhibit rectifying properties for the normal range of input signal swing, provided these signal swings are symmetrical in nature. The transconductance ($g_m$) of a transistor is 40 millimhos per milliampere of emitter current flow. Viewed from its base electrode, the input impedance of a grounded-emitter transistor is $(h_{fe} + 1)/g_m$. The input impedance of transistor 101 looking into its base electrode is $(h_{fe101} + 1)/g_{m101}$, where the numerical subscripts 101 refer the subscripted quantities to transistor 101. The base current of transistor 101 will be equal to its emitter current divided by $(h_{fe101} + 1)$. The quiescent value of this base current will flow as the quiescent emitter current of transistor 111. The quiescent emitter current of transistor 111 is $1/(h_{fe101} + 1)$ times as large as the quiescent emitter current of transistor 101. Therefore, the transconductance of transistor 111, $$g_m = \frac{g_{m101}}{(h_{fe101}+1)} \qquad (12)$$

If a transistor has its base electrode connected to a point much lower in impedance than its base input impedance, then the input impedance it offers is equal to the reciprocal of its $g_m$. In the case of transistor 111 this would mean that the impedance offered at its emitter would be $1/g_{m111}$. By equation 12, however, $1/g_{m111}$ equals $(h_{fe101} + 1)/g_{m111}$. That is, in the quiescent state, the input impedance offered to the source 102 and capacitor 103 at terminal 104 by transistor 111 will be equal to the input impedance offered them by transistor 101.

As the source 102 applies input signal via capacitor 103, the base impedance $Z_{B101}$ of transistor 101 and the emitter impedance $Z_{E111}$ of transistor 111 will be increased and decreased in push-pull. Since the $Z_{B101}$ and $Z_{E111}$ each vary the same way--that is, inversely with current--they will on average present the same impedance to source 102 and capacitor 103, providing that source 102 supplies symmetrically swinging currents. That is, the input impedance characteristic of the amplifier, $Z_{IN} = Z_{B101} Z_{E111}/(Z_{B101} + Z_{E111})$, is symmetrical about average value input signal for the range where transistors 101 and 111 are not overdriven into saturation.

For example, if $Z_{E111} = Z_{B101} = R$ when input signal potential $e_{in} = 0$, then $Z_{IN} = R/2$. Where $I_{IN}$ goes positive to a value such that $Z_{E111} = 2R$ and $Z_{B101} = R_2$, then $Z_{IN} = 2R/5$. Then $I_{IN}$ goes negative to the same extent, that is, to a value such that $Z_{E111} = R/2$ and $Z_{B101} = 2R$, then $Z_{IN} = 2R/5$ for this condition also.

The impedance offered at the collector electrode of transistor 112 can be shown to be substantially $2/g_{m112}$, where $g_{m112}$ is in the transconductance of transistor 112. If current levels in transistors 112 and 101 are the same, $g_{m112} = g_{m101}$, and the base electrode of transistor 111 sees an impedance substantially equal to $2/g_{m101}$. At the same time, the impedance looking into the base electrode of transistor 111, $Z_{B111}$, equals $(h_{fe111} + 1)$ times the effective emitter impedance of transistor 111 in circuit. That is, $$Z_{B111} = (h_{fe111}+1)\frac{1}{g_{m111}} + \frac{(h_{fe101}+1)}{g_{m101}} \qquad (13)$$

A portion of $Z_{B111}$, $(h_{fe111}\, h_{fe101}/g_{m101})$, clearly is much, much larger than the source impedance provided at the collector electrode of the voltage regulating transistor 112. Therefore, the base electrode of transistor 111 is connected to a point much lower in impedance than its base input impedance. So, to very close approximation, input impedances looking into the emitter electrode of transistor 111 will be $1/g_{m111}$, as previously assumed.

For a 1 milliampere collector current flow in like transistors 101 and 112, by way of example, $g_{m101}$ is 40 millimhos. If $h_{fe101}$ has a value of 50, a normal value, then its quiescent base impedance $h_{fe101}/g_{m101}$ will be about 1250 ohms. So, too, will the quiescent emitter impedance of transistor 111 be about 1250 ohms. While a 1250 ohm resistor is easily realized in an integrated circuit--for example, by a P-type resistor formed concurrently with transistor base diffusion--the biasing stability of the grounded-emitter amplifier transistor 101 afforded by such a connection will be substantially inferior to that provided by the arrangement shown in FIG. 1.

The area taken up on the integrated circuit chip by elements 111, 112, 113 and 114 will, in most instances, be smaller than that taken up by a conventional resistive potential divider bias network offering 1250 ohms impedance to the base electrode of transistor 101. If the quiescent collector current in transistor 101 is designed to be 0.1 milliampere, replacing the 12500 ohm resistance offered by the base-emitter junction of transistor 111 with a P-type resistor network would require a substantially larger area on an integrated circuit chip.

The quiescent input impedance at terminal 104 is half what it would be if input signal could be applied to the base electrode of transistor 101 directly without the connection thereto of the emitter electrode of transistor 111. The fact that input signal currents supplied by source 102 are divided substantially equally between transistors 101 and 111 is not of substantial consequence, however, in the usual case where the source impedance of source 102 is lower than the base impedance of transistor 101 and the transconductive properties of transistors 101 are utilized for obtaining amplification. If source 102 is a low impedance source, it also decouples the noise generated in transistors 111, 112 and 114 from the base electrode of transistor 101.

Certain alternative modifications which can be made to the FIG. 1 circuit will occur to the skilled designer. Transistors 101, 111, 112 and 114 may each be replaced by composite transistors, each composite transistor comprising a similar number of individual transistors connected in Darlington cascade. Diode-connected transistor 114 may be replaced by a simple PN junction. The collector electrode of either of transistors 111 and 114 may, alternatively be connected together with the other rather than as shown. The collector electrode of transistor 111 may also be connected to the collector electrode of transistor 101, rather than as shown, reducing the signal current gain between terminal 104 and the base electrode of transistor 107 by a factor $(h_{fe101} - 1)/h_{fe101}$. Such reduction of current gain generally would be negligible.

The current $I_{113}$ can be provided from the collector electrode of a transistor biased for constant collector current flow, rather than by means of resistor 113, and the collector current to transistor 101 can be provided from the collector electrode of another transistor biased for constant collector current flow, rather than by means of resistor 106. Other types of current sources could replace either or both of resistors 113 and 106, also.

Figure 2:
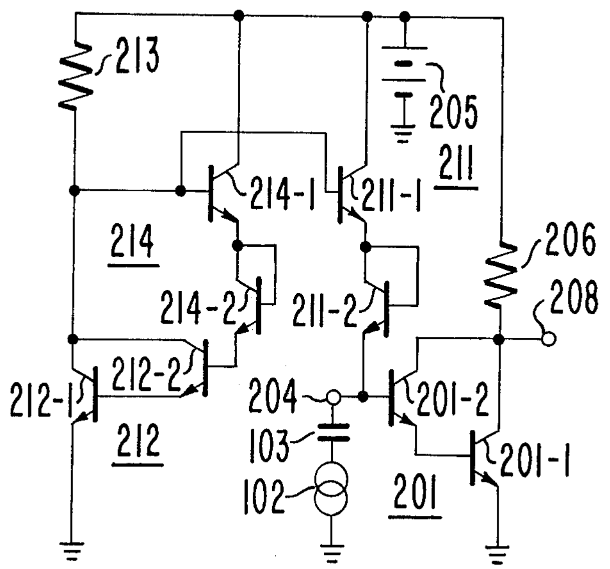
FIG. 2 is a schematic diagram of a grounded-emitter transistor amplifier using a composite transistor comprising a Darlington cascade of component transistors which is biased according to the present invention.

Amplifiers with much higher input impedances but having bias networks which take up little integrated circuit chip area can be achieved using configurations of the nature shown in FIG. 2. The simple transistors 101 and 112 of the FIG. 1 circuit are replaced in the FIG. 2 circuit with Darlington cascades 201 and 212, respectively. Darlington cascade 201 comprises a plurality of transistors 201-1 . . . 201-n. Darlington cascade 212 comprises a plurality $n$ of transistors 212-1 . . . 212-n. The single diode offset potentials provided by transistors 111 and 114 of the FIG. 1 circuit are replaced with plural diode offset potentials provided by serial combinations 211 and 214, respectively. Serial combination 211 comprises the serially connected collector-to-emitter paths of a plurality n of transistors 211-1 . . . 211-n. Transistor 211-1 has, serially connected in its emitter circuit, the rest of the transistors in combination 211, which are each diode-connected. Serial combination 214 comprises the serially connected collector-to-emitter paths of plurality n of serially-connected diode-connected transistors 214-1 . . . 214-n, connected analagously to transistors 211-1 . . . 211-n, respectively. Elements 204, 205, 206, 208 and 213 correspond substantially in function to elements 104, 105, 106, 108, and 113, respectively of FIG. 1.

Assume all the transistors in FIG. 2 to have the same $H_{fe}$. For purposes of illustration, assume $n$=2. The base impedance of transistor 201-1 is $(h_{fe}+1)/g_{m201}$, and its base current is $I_{E201\text{-}1}/(h_{fe}+1)$. The internal emitter resistance of transistor 201-2 is $(h_{fe}+1)/g_{m101\text{-}1}$, because of its emitter current being smaller than that of transistor 100-1 by the factor $(h_{fe}+1)$. Added to the base impedance of transistor 201-1, this causes the emitter impedance of transistor 201-2 in circuit to be $2(h_{fe}+1)/g_{m201\text{-}1}$. The base impedance of transistor 201-2 in circuit will be $(h_{fe}+1)$ times its emitter resistance in circuit—that is, $2(h_{fe}+1)^2/g_{m201\text{-}1}$.

The quiescent base current of transistor 201-2 will be $I_{E201\text{-}1}/(h_{fe}+1)^2$. The quiescent emitter currents of transistors 211-1 and 211-2 are each equal to the base current of transistor 201-2, which is $(h_{fe}+1)^2$ times smaller than $I_{E201\text{-}1}$. The resistance of a diode-connected transistor is one over its own $g_m$, so the resistance of diode-connected transistor 211-2 between (1) its emitter electrode and (2) its joined base and collector electrodes is $(h_{fe}+1)^2/g_{m201\text{-}1}$. The emitter impedance of grounded-base transistor 211-1 is one over its $g_m$ also, which also equals $(h_{fe}+1)^2/g_{m201\text{-}2}$. Serial combination 211 offers a resistance coupling source 202 and the base electrode of transistor 201-2. Serial combination 211 has a quiescent impedance $2(h_{fe}+1)^2/g_{m201\text{-}1}$, which is equal to the quiescent base impedance of transistor 201-2 in circuit.

The desired condition of the non-linear "base" biasing impedance provided to the composite amplifier transistor device equaling its own non-linear "base" impedance is thus met, and the serial combination 211 will not introduce any undesired rectifying effects for the normal range of input signals from source 202. This result can be extended for larger values of $n$ by carrying the same analytical technique further.

$Z_{IN}$, the quiescent input impedance presented at terminal 204 by the FIG. 2 amplifier, is described by the following expression:

$$Z_{IN}=\frac{n\,(h_{fe}+1)^n}{2g_{m201\text{-}1}} \tag{14}$$

Again assuming $h_{fe}=49$ and $g_{m201\text{-}1}$= 40 millimhos ($I_E$ equaling 1 milliampere) the following table of $Z_{IN}$ versus n can be drawn.

| n | $Z_{IN}$ in ohms |
|---|---|
| 1 | 625 |
| 2 | $62.5\cdot10^3$ |
| 3 | $4.7\cdot10^6$ |
| 4 | $313\cdot10^6$ |

Higher values of $Z_{IN}$ may not actually be achievable because of leakage resistances and capacitances in the integrated circuit. But, the fact that very high input impedances can be obtained for an amplifier is apparent.

FIG. 3 shows a modification of the FIG. 1 configuration adapting it for use as a phase-splitter to develop push-pull output signals at output terminals 306 and 307 in response to signals applied to input terminal 104 from source 102. As previously pointed out, the input signal from source 102 causes base current into transistor 101 and emitter current into transistor 111 to vary in push-pull relationship with each other. Let the input signal variations be $i_{IN}$. Then, the output signal $v_{307}$ appearing at output terminal 307 due to the grounded-emitter amplifier action of transistor 101 will be given by the following equation, wherein $h_{fe101}$ is the common-emitter forward current gain of transistor 101 and $R_{106}$ is the resistance of resistor 106 connected as the collector load of transistor 101.

$$v_{307}=-i_{IN}h_{fe101}R_{106} \tag{15}$$

The input signal variations are also amplified by the common-base amplifier action of transistor 111 to provide collector current signal variations which equal $i_{IN}h_{fe111}/(h_{fe111}+1)$, where $h_{fe111}$ is the common-emitter forward current gain of transistor 111. A current mirror amplifier 300 has an input terminal 301 connected to receive the collector current signal variations from transistor 111, has a common terminal 302 connected to source 105 of operating potential, and has an output terminal 303 which supplies an inverted replica of the collector current signal variations of transistor 111 to the base electrode of transistor 304. That is, the current gain of current mirror amplifier 300 is essentially minus unity (−1), and the signal current applied to the base electrode of transistor 304 is $-i_{IN}h_{fe111}/(h_{fe111}+1)$. The output signal $v_{306}$ appearing at output terminal 306 due to the grounded-emitter amplifier action of transistor 304 will be given by the following equation, wherein $h_{fe304}$ is the common-emitter forward current gain of transistor 304 and $R_{305}$ is the resistance of resistor 305 connected as the collector load of transistor 304.

$$V_{306} = -i_{IN} \frac{h_{fe111}}{(h_{fe111}+1)} h_{fe304} R_{305} \quad (16)$$

Since $h_{fe111}$ normally exceeds 50 or so, the fraction $h_{fe111}/(h_{fe111}+1)$ equals unity within 2% error. Therefore, if $h_{fe304}$ equals $h_{fe101}$ and $R_{106}$ equals $r_{305}$, both of which conditions can be closely adhered to for example, in a monolithic integrated circuit, $v_{107}$ and $v_{306}$ will be antiphase signals exhibiting similar absolute variations and swinging in opposite senses. Proper selection of $R_{106}$ and $R_{305}$ will permit $v_{107}$ and $v_{306}$ to swing over the entire range of operating potential provided by supply 105.

The application of the present invention to phase splitting circuitry of the sort shown in FIG. 3 suggests that transistor 304 might alternatively have its collector-to-emitter path serially connected with that of transistor 101 thereby to provide a quasi-complementary push-pull amplifier connection. Indeed, this may be done. Furthermore, as shown in FIG. 4, the biasing provided by elements 112, 113, and 114 can be modified to provide for Class AB or Class B operation of the amplifier.

In the FIG. 4 amplifier, $R_{113}$, the resistance of resistor 113, is chosen to cause the current $I_{113}$ therethrough to be a low value proportionally related to the idling or quiescent collector-to-emitter currents of transistors 101 and 304. This results in the emitter-to-collector potential $V_{E112}$ of transistor 112 being a low-valued $2V_{BE}$ potential, which if applied directly between the base electrode of transistor 111 and the emitter electrode of transistor 101 would cause the desired idling current to flow through the collector-to-emitter paths of transistors 304 and 101. Such direct application is not made however, since in such instance large negative swings of input signal would cause sufficient base current into transistor 111 to disrupt the voltage regulator action of elements 112, 113, 114, which has been weakened insofar as handling of large load current is concerned by the reduction of $I_{113}$.

To prevent withdrawing of excessive current from the voltage regulator formed by elements 112, 113, 114 a common-collector amplifier transistor 401 is arranged to provide a buffer amplifier between the collector electrode of transistor 112 and the base electrode of transistor 401. To compensate for the base-emitter offset potential of transistor 401 introduced between the collector electrode of transistor 112 and the base electrode of transistor 111, the emitter electrode of transistor 112 is biased more positively in potential by like amount. Transistor 402 has a collector-to-base degenerative feedback connection which causes it to function like a diode for the passage of current substantially equal to $I_{113}$. The base-emitter potential $V_{BE402}$ of transistor 402 assumes the value required to accept the passage of current substantially equal to $I_{113}$ through its emitter electrode. $V_{BE402}$ is applied to the base-emitter junction of a transistor 404, which has a transconductance characteristic matched to that of transistor 402. Transistor 404 therefore responds to application of $V_{BE402}$ to its base-emitter junction to withdraw a collector current from the emitter electrode of transistor 401 substantially equal to $I_{113}$ and to the emitter current of transistor 402. Since their quiescent emitter currents are substantially equal, the base-emitter offset potentials $V_{BE401}$ and $V_{BE402}$ of transistors 401 and 402, respectively, are substantially equal.

The FIG. 4 amplifier will respond to pronounced, positive excursions of input signal current $i_{IN}$ in the following way. The positive input signal current will flow into the base-emitter junction of grounded-emitter amplifier transistor 101, causing an increase in its collector current $h_{fe101}$ times as large and increasing the $V_{BE101}$ potential appearing at its base electrode. Since the base electrode of transistor 111 is held at a relatively fixed potential, the increase in $V_{BE101}$ will force a decrease in the base-emitter potential $V_{BE111}$ of transistor 111 which renders transistor 111 non-conductive. Consequently, there will not be any collector current supplied from transistor 111 to input terminal 301 of current mirror amplifier 300. Current mirror amplifier 300 will respond to lack of input current thereto to supply no base current from its output terminal 303 to the base electrode of transistor 304. So, therefore, transistor 304 will be non-conductive, and the increased collector current of transistor 101 will have to be supplied from the load (not shown) connected to output terminal 407.

On the other hand, operation of the FIG. 4 amplifier for pronounced, negative excursions of input signal $i_{IN}$ is as follows. The negative input signal current will be withdrawn from the base-emitter junction of transistor 111 increasing $V_{BE111}$, which forces a decrease in $V_{BE101}$, and thereby curtails conduction of transistor 101. The commonbase amplifier action of transistor 111 causes its collector current to increase in accordance with the excursion of $i_{IN}$ to a more negative value. Current mirror amplifier 300 responds to this increased collector current of transistor 101 withdrawn from its input electrode 301 to supply increased base current to transistor 304. This increase in its base current causes transistor 304 to supply increased emitter current. since transistor 101 is non-conductive, the increased emitter-current of transistor 304 must flow to a load (not shown) connected to output terminal 407.

Quasi-complementary push-pull amplifiers using a composite transistor 201 comprising n individual transistors 201-1, . . . 201-n connected in Darlington cascade and a composite transistor 501 comprising n individual transistors 501-1, . . . 501-n connected in Darlington cascade are possible. A schematic diagram for such an amplifier wherein $n=2$ is shown in FIG. 5. It is related to the grounded-emitter amplifier circuit of FIG. 2 using composite transistor 201 in a manner analagous to the manner in which the FIG. 4 push-pull amplifier is related to the grounded-emitter amplifier circuit of FIG. 1 using transistor 101. A bleeder resistor 502 applies additional forward bias current to transistor 402, which in turn increases the emitter currents of transistors 402, 404, and 401. This provides still a lower source impedance for applying bias potential to the base electrode of transistor 211-1. Similar measures can be taken to lower the source impedance presented to the base electrode of transistor 111 in the FIG. 4 push-pull amplifier.

FIGS. 6 and 7 show two well-known circuits which are representative of circuits which can be used as current mirror amplifier 300 in the FIGS 3, 4 and 5 configuration. These circuits each utilize matched transistors and often the pair of transistors shown having their emitter electrodes connected directly to terminal 302 have their emitter electrodes connected thereto by means of first and second resistors, respectively, which resistors are equal in resistance.

In the claims, the term "transistor" refers to circuits functioning as composite transistors such as may be formed by Darlington connection of individual transistors, as well as to individual transistors.

What is claimed is:

1. In combination:

first, second and third terminals for receiving a reference potential, a multiple $-V_{BE}$ potential and an operating potential, respectively;

a first transistor having base and emitter electrodes with a base-emitter junction therebetween and having a collector electrode, said first transistor emitter electrode being directly connected to said first terminal;

at least one further semiconductor junction which together with the base-emitter junction of said first transistor comprise an even-numbered plurality of semiconductor junctions, said even-numbered plurality of semiconductor junctions being connected in serial connection between said first and said second terminals without substantial intervening impedances, and poled for being forward biased by said multiple $-V_{BE}$ potential, said first transistor base-emitter junction being so connected at its base electrode to the preceding semiconductor junction in said serial connection so that it will conduct substantially the entirety of any quiescent current flowing through said preceding semiconductor junction;

a source of input signal connected to the midpoint of said serial connection of an even-numbered plurality of semiconductor junctions; and further means for connecting said first transistor in a common-emitter amplifier configuration for providing a first output signal at said first transistor collector electrode, responsive to said input signal, said further means including a direct current conductive connection of said first transistor collector electrode to said third terminal.

2. The combination set forth in claim 1 wherein said second transistor collector electrode is biased to permit normal transistor operation of said second transistor by being connected to said second terminal.

3. The combination set forth in claim 1 wherein said second transistor collector electrode is biased to permit normal transistor operation of said second transistor by being connected to said third terminal.

4. A transistor amplifier circuit comprising, in combination:

a composite first transistor having "base," "emitter" and "collector" terminals, said composite transistor comprising (n+1) component transistors of the same conductivity type having respective base-emitter junctions in said serial connection between the "base" and "emitter" terminals of said composite transistor, where *n* is a positive integer, each of said component transistors having a collector electrode reverse-biased with respect to its base electrode, the collector electrode of at least one of said component transistors being connected to the "collector" terminal of said composite transistor and said emitter electrode terminal being connected to a point of reference potential by a substantially zero impedance path;

a second transistor being of said same conductivity type, having base and emitter and collector electrodes, and having substantially the same structure and characteristics as one of said component transistors of said first transistor;

a number, n, of semiconductor junctions serially connected between said second transistor emitter electrode and said first transistor "base" terminal for forward conduction of the quiescent emitter current of said second transistor and quiescent "base" terminal current of said first transistor, which quiescent currents are substantially identical to each other in value;

means for applying a direct bias potential to said second transistor base electrode to cause said quiescent currents;

an operating voltage terminal for connection of an operating voltage source;

means coupling the "collector" terminal of said first transistor to said operating voltage terminal;

separate means coupling the collector electrode of said second transistor to said operating voltage terminal;

a signal terminal connected to the "base" terminal of said first transistor; and a signal output terminal at the "collector" terminal of said first transistor.

5. A transistor amplifier circuit as set forth in claim 4 wherein said means for supplying forward current comprises:

a composite third transistor of said same conductivity type, having "base" and "emitter" and "collector" terminals, said third transistor comprising (n+1) component transistors having respective base-emitter junctions in series connection between the "base" and "emitter" terminals of said third transistor, each of the component transistors of said third transistor having a collector electrode reverse-biased with respect to its base electrode, the collector electrode of at least one of the component transistors of said third transistor being connected to the "collector" terminal of said third transistor, said third transistor "emitter" terminal being connected to said point of reference potential, a fourth transistor being of said same conductivity type, aving base and emitter and collector electrodes, and having substantially the same structure and characteristics as one of said component transistors of said third transistor, said fourth transistor base electrode being connected to said third transistor "collector" terminal, said fourth transistor emitter electrode being connected to said second transistor base electrode;

a current supply connected between the "emitter" and "collector" terminals of said third transistor; and n semiconductor junctions connected between said fourth transistor emitter electrode and said third transistor "base" terminal, poled for conduction of the emitter current of said fourth transistor, and thereby serially connected with the base-emitter junction of said fourth transistor.

means for applying reverse bias between the collector and base electrodes of said second transistor; and further means connecting said first transistor in common emitter amplifier configuration including means for applying reverse bias between its collector and base electrodes, a signal input terminal coupled to the base electrode of said first transistor, and a signal output terminal coupled to the collector electrode of said first transistor.

6. A transistor amplifier circuit as set forth in claim 4 wherein said means for supplying said forward current comprises:

a composite third transistor of said same conductivity type, having "base" and "emitter" and "collector" terminals, said third transistor comprising (n+1) component transistors having respective base-emitter junctions in series connection between the "base" and "emitter" terminals of said third transistor, each of the component transistors of said third transistor having a collector electrode reverse-biased with respect to its base electrode, the collector electrode of at least one of the component transistors of said third transistor being connected to the "collector" terminal of said third transistor, (n+1) semiconductor junctions connected between the "collector" and "base" terminals of said third transistor and poled to be forward biased by the "base" terminal current of said third transistor;

fourth and fifth and sixth transistors of said same conductivity type, each having base and emitter and collector electrodes, the emitter electrodes of said fourth and fifth transistors being connected to said point of reference potential, the collector electrode of said fourth transistor and the base electrodes of said fourth and fifth transistors each being connected to the "emitter" terminal of said third transistor, the base electrode of said sixth transistor being connected to the "collector" terminal of said third transistor, the collector electrode of said sixth transistor being reverse-biased with respect to its base electrode, and the emitter electrode of said sixth transistor having the base electrode of said fourth transistor and the collector electrode of said fifth transistor connected thereto; and a current supply connected between said point of reference potential and said third transistor "collector" terminal.

7. The combination set forth in claim 1 wherein the one of said even-numbered plurality of semiconductor junctions connected in said series connection which is most closely connected to said second terminal comprises the base-emitter junction of a second transistor having a base electrode connected to said second terminal, having an emitter electrode between which and its said base electrode said base-emitter junction reposes and having a collector electrode biased to permit normal transistor operation of said second transistor.

8. The combination comprising:

first, second and third terminals for receiving a reference potential, a multiple $V_{BE}$ potential and an operating potential, respectively;

a fourth terminal for receiving an input signal current;

a fifth terminal;

a first transistor which is a composite device comprising a plurality of component transistors with their base-emitter junctions serially connected between said first and said second terminals and poled to tend to be forward-biased by said multiple $V_{BE}$ potential, with a first of said component transistors having its emitter electrode connected to said first terminal and having its collector electrode connected to said fifth terminal and the collector electrodes of the other component transistors being connected so as to reverse-bias their base-collector junctions;

a plurality of semiconductor junctions equal in number to said plurality of component transistors, said plurality of semiconductor junctions being serially-connected with each other between said second and said fourth terminals, being poled for conducting the base current of said first transistor and providing the sole path for the base current of said first transistor, said first transistor base current being the sole current flowing through said plurality of semiconductor junctions; and means connected between said third and said fourth terminals for completing the connection of said first transistor as a common-emitter amplifier providing a first output signal at said fifth terminal responsive to said input signal current, said means having a direct current conductive path therethrough for conducting the quiescent collector current of said first transistor.

9. The combination set forth in claim 8 wherein:

a second transistor having a base electrode connected to said second terminal and having emitter and collector electrodes has a base-emitter junction between its said base and emitter electrodes corresponding to one of the plurality of said semiconductor junctions serially connected between said second and said fourth terminals;

a current mirror amplifier has an input terminal connected to said second transistor collector electrode, has a common terminal connected to said third terminal, and has an output terminal;

a third transistor, which is a composite device of similar structure to said first transistor, has a base electrode connected to said current mirror amplifier output and has emitter and collector electrodes with a emitter-to-collector path therebetween; and means are provided for connecting said third transistor emitter-to-collector path between said first terminal and said third terminal.

10. The combination set forth in claim 9 wherein said means for connecting said third transistor emitter-to-collector path between said first terminal and said third terminal comprises:

a connection of said third transistor emitter electrode to said first transistor collector electrode, and a connection of said third transistor collector electrode to said third terminal.

11. The combination set forth in claim 10 further including:

a fourth transistor, which is a composite device of similar structure to said first transistor and has base and emitter and collector electrodes;

means for supplying a current at a relatively high impedance to the collector electrode of said fourth transistor;

another plurality of semiconductor junctions of number equal to said plurality of semiconductor junctions serially connected between said second and said fourth terminals, said other plurality of semiconductor junctions being serially connected between the collector and the base electrodes of said fourth transistor and being poled for forward conduction of base current to said fourth transistor;

a fifth transistor having a base electrode connected to said fourth transistor collector electrode and having an emitter and a collector electrodes respectively connected to said second terminal and said third terminal; and sixth and seventh transistors each having similar transconductance characteristics to said fifth transistor, each having an emitter electrode connected to said first terminal, each having a collector electrode, and each having a base electrode connected to said sixth transistor collector electrode, the collector electrodes of said sixth and said seventh transistors being respectively connected to the respective emitter electrodes of said fourth and said fifth transistors.

12. An amplifier circuit comprising, in combination:

first and second transistors of the same conductivity type, each having base and emitter and collector electrodes, said first transistor being directly connected at its emitter electrode to a point of reference potential;

means directly connecting the base electrode of said first transistor to the emitter electrode of said second transistor for causing said first transistor base electrode to receive, when present, substantially the entire quiescent emitter current flow of said second transistor;

means for applying a direct potential to the base electrode of said second transistor of a polarity to cause a quiescent current flow between the emitter electrode of said second transistor and the base electrode of said first transistor;

means for applying reverse bias between the collector and base electrodes of said second transistor; and further means connecting said first transistor in common emitter amplifier configuration including means for applying reverse bias between its collector and base electrodes, a signal input terminal coupled to the base electrode of said first transistor, and a signal output terminal coupled to the collector electrode of said first transistor.

13. An amplifier circuit as set forth in claim 12 wherein said means for applying a quiescent potential between said emitter electrode of said first transistor and said base electrode of said second transistor comprises:

third and fourth transistors of said same conductivity type, each having base and emitter and a collector electrodes, said third transistor being directly connected at its emitter electrode to said reference potential and connected at its base electrode to the emitter electrode of said fourth transistor to receive its entire quiescent current flow; the base electrode of said fourth transistor being connected to the base electrode of said second transistor;

means for applying reverse bias between the collector and base electrodes of said fourth transistor;

a supply of current of determined value connected between the emitter and collector electrodes of said third transistor; and a direct coupled negative feedback connection from the collector electrode of said third transistor to the base electrode of said fourth transistor, to regulate the collector current of said third transistor to a value substantially equal to said determined value.

14. An amplifier circuit as set forth in claim 12 wherein said means for applying a quiescent potential between said emitter electrode of said first transistor and said base electrode of said second transistor comprises:

third and fourth and fifth and sixth and seventh transistors of said same conductivity type, each having base and emitter and collector electrodes, said third transistor being connected at its base electrode to the emitter electrode of said fourth transistor and connected at its emitter electrode to the collector electrode to the collector electrode of said fifth transistor and to the base electrodes of said fifth and said sixth transistors, said fifth and said sixth transistors being directly connected at their emitter electrodes to said reference potential said seventh transistor beinng connected at its base electrode to the collector electrode of said third transistor and at its emitter electrode to the base electrode of said second transistor and the collector electrode of said sixth transistor;

means for applying reverse bias to between the collector and base electrodes of said fourth transistor;

means for applying reverse bias between the collector and base electrodes of said seventh transistor;

a supply of current of determined value connected between the collector electrode of said third transistor and the emitter electrodes of said fifth and said sixth transistors; and a direct coupled negative feedback connection from the collector electrode of said third transistor to the base electrode of said fourth transistor, to regulate the collector current of said third transistor to a value substantially equal to said determined value.

15. An amplifier circuit as claimed in claim 12 further including:

a current mirror amplifier having an input circuit included in said means for applying reverse bias between the collector and base electrodes of said second transistor, its input circuit being arranged to sense the collector current of said second transistor, and having an output circuit;

a third transistor having a base electrode connected to said output circuit of said current mirror amplifier, having an emitter electrode coupled to said signal output terminal and having a collector electrode; and means for applying reverse bias between the collector and base electrodes of said third transistor.

16. An amplifier circuit as claimed in claim 12 further including:

a current mirror amplifier having an output circuit included in said means for applying reverse bias between the collector and base electrodes of said second transistor, its input circuit being arranged to sense the collector current of said second transistor, and having an output circuit;

a third transistor having a base electrode connected to said output circuit of said current mirror amplifier, having an emitter electrode coupled to said reference potential and having a collector electrode;

means for applying reverse bias between the collector and base electrodes of said third transistor; and another signal output terminal connected to the collector electrode of said third transistor.

17. The combination set forth in claim 7 further including:

a third transistor having base and emitter electrodes with a base-emitter junction therebetween and having a collector electrode;

a current mirror amplifier having an input terminal connected to said second transistor collector electrode, a common terminal connected to said third terminal and an output terminal connected to said third transistor base electrode; and means for connecting said third transistor as a common-emitter amplifier thereby to provide a second output signal at its collector electrode in response to said input signal.

18. The combination set forth in claim 17 wherein:

a first resistor is included in said direct current conductive connection of said first transistor collector electrode to said third terminal;

said current mirror amplifier has a current gain substantially equal to minus unity; and said means for connecting said third transistor as a common emitter amplifier includes a direct connection of its emitter electrode to said first terminal and includes a second resistor connecting said third transistor collector electrode to said third terminal, said first and said second resistors having substantially equal resistance values.

19. The combination set forth in claim 7 further including:

a third transistor having base and emitter electrodes with a base-emitter junction therebetween and having a collector electrode, said third transistor emitter electrode being connected to said first transistor collector electrode and said third transistor collector electrode being connected to said third terminal thereby to provide said direct current conductive connection of said first transistor collector electrode to said third terminal; and a current mirror amplifier having a common terminal connected to said third terminal, having an input terminal connected to said second transistor collector electrode and having an output terminal connected to said third transistor base electrode.

20. The combination set forth in claim 19 further including:

fourth and fifth and sixth and seventh and eighth transistors, each having base and collector electrodes with a base-collector junction therebetween and having an emitter electrode;

means for supplying a current at a relatively high impedance connected to the collector electrode of said fourth transistor;

means for reverse-biasing the base-collector junctions of said fifth and said sixth transistors connected to each of their said collector electrodes;

means for connecting the base electrodes of each of said fifth and said sixth transistors to the collector electrode of said fourth transistor;

means for connecting the emitter electrodes of said fifth and said sixth transistors to said fourth transistor base electrode and to said second terminal, respectively;

means for connecting the collector electrodes of said seventh and eighth transistors to the emitter electrodes of said fourth and said fifth transistors, respectively;

means for connecting the base electrodes of said seventh and said eighth transistors to said seventh transistor collector electrode; and means for connecting the emitter electrodes of said seventh and said eighth transistors to said first terminal.

* * * * *

UNITED STATES PATENT OFFICE

CERTIFICATE OF CORRECTION

PATENT NO. : 3,903,479

DATED : September 2, 1975

INVENTOR(S) : Allen LeRoy Limberg

It is certified that error appears in the above-identified patent and that said Letters Patent are hereby corrected as shown below:

Column 3, line 45, "sis" should read --is--.

Column 3, line 49, "$_{IS114}$" should read --$I_{S114}$--.

Column 4, equation 11, should read $$--I_{E101} = I_{113}\sqrt{\frac{I_{S101}\ I_{S111}\ (h_{fe101} + 1)}{I_{S112}\ I_{S114}\ (h_{fe112} + 1)}} \quad (11)--$$

Column 5, line 53, "$_{R/}2$" should read --R/2--.

Column 7, line 35, "$H_{fe}$" should read --$h_{fe}$--.

Column 7, line 56, "$(h_{fe} + 1)^2/g_{m201-2}$" should read

--$(h_{fe} + 1)^2/g_{m201-1}$--.

Column 9, line 8, "$r_{305}$" should read --$R_{305}$--.

Column 10, line 38, "since" should read --Since--.

Column 11, line 43, "claim 1" should read --claim 7--.

Column 11, line 47, "claim 1" should read --claim 7--.

Column 12, line 48, "aving" should read --having--.

Column 12, lines 65-67 should be deleted.

Column 13, lines 1-8 should be deleted.

Column 13, line 24, "," should read --;--.

Column 15, line 55, delete "a".

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*